United States Patent [19]
Bae et al.

[11] Patent Number: 5,240,868
[45] Date of Patent: Aug. 31, 1993

[54] METHOD OF FABRICATING METAL-ELECTRODE IN SEMICONDUCTOR DEVICE

[75] Inventors: Byungseong Bae; Jeongha Sohn, both of Seoul; Insik Jang, Kyunggi; Sangsoo Kim, Seoul; Namdeog Kim, Seoul; Hyungtaek Kim, Seoul, all of Rep. of Korea

[73] Assignee: Samsung Electronics Co., Ltd., Kyunggi, Rep. of Korea

[21] Appl. No.: 810,848

[22] Filed: Dec. 20, 1991

[30] Foreign Application Priority Data

| Apr. 30, 1991 | [KR] | Rep. of Korea | 91-7009 |
| Apr. 30, 1991 | [KR] | Rep. of Korea | 91-7010 |
| Jul. 5, 1991 | [KR] | Rep. of Korea | 91-11375 |

[51] Int. Cl.⁵ .......................................... H01L 21/283
[52] U.S. Cl. ................................. 437/40; 437/192; 437/194; 437/237; 205/124
[58] Field of Search ............... 437/40, 235, 236, 237, 437/170, 192, 194; 148/DIG. 105; 205/124

[56] References Cited

U.S. PATENT DOCUMENTS

| 3,864,217 | 2/1975 | Takahata et al. | 437/237 |
| 3,939,047 | 2/1976 | Tsunemitsu et al. | 205/124 |
| 4,098,637 | 7/1978 | Bell | 437/237 |
| 4,158,613 | 6/1979 | Sogo | 205/124 |
| 4,432,134 | 2/1984 | Jones et al. | 437/190 |
| 4,469,568 | 9/1984 | Kato et al. | 437/239 |

FOREIGN PATENT DOCUMENTS

| 52-71980 | 6/1977 | Japan | 437/237 |
| 53-107284 | 9/1978 | Japan | 437/237 |

Primary Examiner—T. N. Quach
Attorney, Agent, or Firm—Christie, Parker & Hale

[57] ABSTRACT

A method of fabricating a metal electrode of a semiconductor device that includes a substrate with unanodized and anodized metal layers thereon includes the steps of forming a first metal layer, which is anodizable, to a first predetermined thickness on a substrate; forming and patterning a second metal layer, which is not anodizable, to a second predetermined thickness so as to act as a mask on the first metal layer; depositing a third metal layer, that may be anodizable, to a third predetermined thickness; and forming a flat surface on the third layer by anodic oxidation. Various preferred embodiments and relationships between thickness of each layer for flattening by anodic oxidation are also given.

5 Claims, 4 Drawing Sheets

METHOD OF FABRICATING METAL-ELECTRODE IN SEMICONDUCTOR DEVICE

BACKGROUND OF THE INVENTION (1) Field of the Invention

The present invention relates to a method of fabricating a metal electrode of a semiconductor device.

(2) Description of the Prior Art

In line with the increase of the concentration of the density of a semiconductor device, the semiconductor device has become miniaturized and lightened. However, in a semiconductor device, the speed of vertical reduction is lower than the speed of horizontal reduction, and step coverage between each layer forming a semiconductor device is a critical factor regarding efficiency and reliability of a semiconductor device.

Especially, in the case of a thin film transistor used in a flat display device, a method of preventing a metal electrode on a glass substrate from forming differential step has been studied.

In general, a metal process is a latter one among the processes of fabricating a semiconductor device, and when it comes to a thin film transistor of reverse staggered type, a metal process is an initial one for forming a gate electrode on an insulating substrate.

According to a detailed embodiment of the prior art shown in FIG. 1A or 1B, a metal layer made of chromium Cr and the like is formed on a glass substrate by carrying out a sputtering or chemical vapor deposition (hereinafter CVD), and a desired pattern is then formed by wet etching such that a gate electrode 2 is formed. Subsequently, as a gate insulating layer 3, e.g., a nitride silicon layer is formed by CVD. The above described conventional processes have problems that step coverage of serially deposited layers deteriorates due to the differential step and a satisfactory element cannot be obtained.

Where an insulating layer 4 is formed by partial anodic oxidation of the gate electrode and in forming an insulating layer 4, as shown in FIG. 2B, if another film is deposited thereon by CVD, step coverage would deteriorate, which results in problems of deteriorating reliability and efficiency. The above problems are considered serious in thin film transistors and must be solved.

SUMMARY OF THE INVENTION

An object of the present invention is to provide a method of fabricating a metal electrode of a semiconductor device capable of removing differential step between an oxide film, nitride film, and a glass substrate and a metallization layer.

In order to obtain the above object, the present invention includes the processing steps of:

forming and patterning a first metal layer which is not anodizable to a predetermined thickness on the substrate;

forming a second metal layer which is anodizable, on the substrate; and forming a mask corresponding to the first metal layer on the second metal layer and forming a flat surface by anodic oxidation in order that regions other than the first and second metal patterns become an insulator having the same vertical elevation as the surface of the substrate.

Furthermore, according to a second preferred embodiment of the present invention, there is provided another processing steps of:

forming and patterning a first metal layer, which is not anodizable, to a first predetermined thickness on a substrate;

forming a second metal layer which can be anodized to a second predetermined thickness on the substrate by anodic oxidation;

forming a mask corresponding to the first metal layer on the second metal layer and anodizing the unmasked region of the second metal pattern; and anodically oxidizing the portion of the second metal layer which is not anodized after the mask is removed.

According to a third preferred embodiment of the present invention, the present invention still more includes a method of metallization comprising the steps of:

forming a first metal layer which is anodizable, to a first predetermined thickness on a substrate;

forming and patterning a second metal layer, which is not anodizable, to a second predetermined thickness so as to act as a mask on the first metal layer;

depositing a third metal layer, that may be anodized, to a third predetermined thickness; and forming a flat surface by anodic oxidation throughout the substrate.

As a fourth embodiment of the present invention, the present invention still further includes a method comprising the steps of:

forming serially a first metal layer, a second metal layer and a photo-sensitive film on the substrate and patterning the photo-sensitive film;

diagonally etching the second metal layer, with the patterned photo-sensitive film;

removing the photo-sensitive film after anodizing the exposed first metal layer, using the pattern of photo-sensitive film and the second metal layer as a mask.

DESCRIPTION OF THE PREFERRED EMBODIMENTS

Figure 1A:
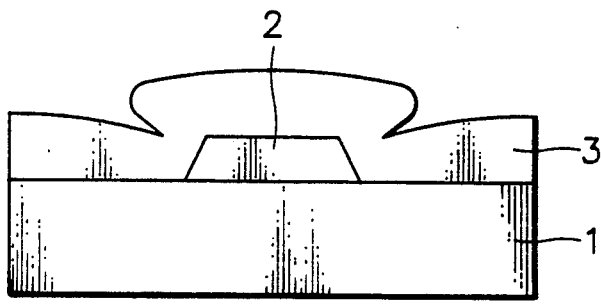
FIGS. 1A and 1B are schematic views of a conventional embodiment.
Figure 1B:
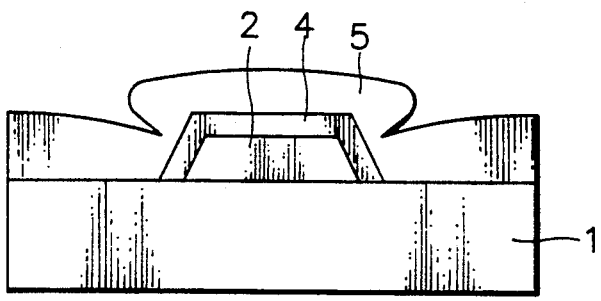

Referring now to the drawings, a preferred embodiment of this invention will be described in detail.

FIGS. 2A through 2D show successive manufacturing stages of a first embodiment according to the present invention.

Figure 2A:
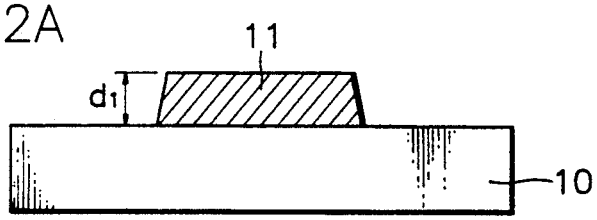
FIGS. 2A to 2D are schematic views showing successive manufacturing stages of first and second embodiments according to the present invention.

As shown in FIG. 2A, first metal layer 11 having a thickness of $d_1$ is deposited on a semiconductor substrate or an insulating substrate 10 of glass material by sputtering and then patterned by etching to have a prescribed of predetermined width. An oxide film or a nitride film may be used as a first layer as well as glass and metal materials such as copper (Cu) or chromium (Cr) since they are not influenced by anodic oxidation. A thickness of this metal layer is shown as "$d_1$".

Figure 2B:
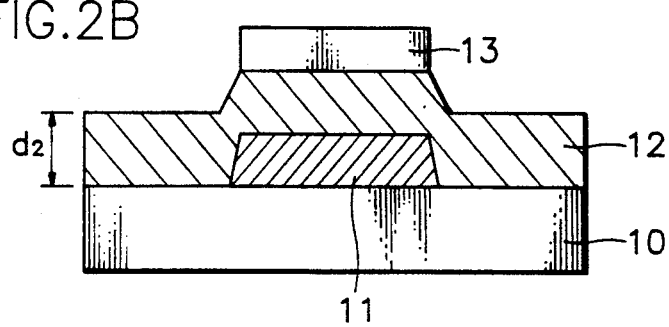

Successively, as shown in FIG. 2B, a second metal layer 12 is deposited on the substrate on which the first metal layer 11 is formed, and a photoresist layer 13 is then patterned to be in alignment with the first metal layer 11. The photoresist is placed on the portion where differential step is formed. Another film such as a silicon nitride or oxide silicon film can be used instead of the photoresist layer, if necessary.

Here, the type of the second metal layer 12 is a material for anodic oxidation such as Al or Ta, and the thickness thereof is indicated as "$d_2$" in the drawing.

As well known, anodic oxidation is a method of forming an oxide film on an electrode by acting the electrode as anode in an electrolytic chamber. The semiconductor device shown in FIG. 2B is placed in an electrode chamber, and anodic oxidation is performed by applying voltage and current of a proper level for a prescribed time such that the whole second metal layer 12 is anodic-oxidized to become an oxide layer.

Figure 2C:
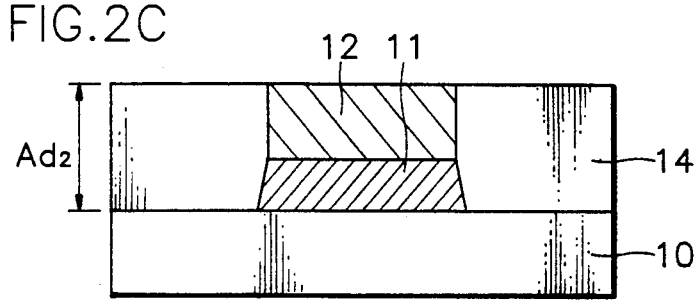
Figure 2C:
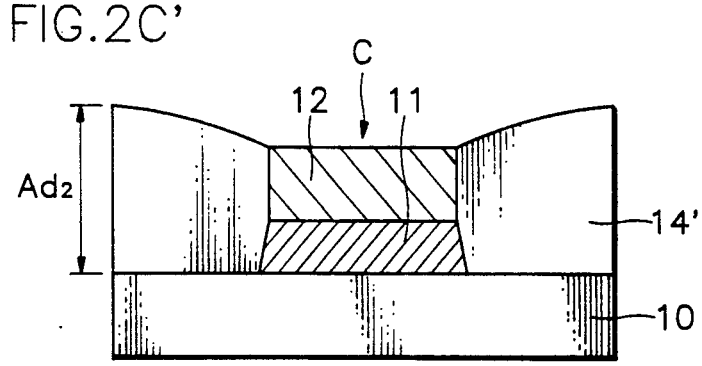

The photoresist layer 13 acting as a mask in the present embodiment allows the region other than the first metal layer 11 and the second layer 12 to be anodized. When the structure showed in FIG. 2B is anodized, flattened insulating layers 14 are obtained as shown in FIG. 2C. If a variation rate of thickness at the time of anodic oxidation is designated with "A" which is a proportional constant, the thickness of the anodized layer becomes $Ad_2$. For example, if aluminum is used in this embodiment, the variation rate of thickness "A" is about 1.4, which can be obtained from an experiment. The thickness of the anodized layer $Ad_2$ can be controlled by a voltage supplied at the time of anodic oxidation (refer to U.S. Pat. No. 4,469,568).

The relationship between $d_1$, $d_2$ and A is defined as the following formulae:

$$Ad_2 = d_2 + d_1$$

$$\therefore d_1 = (A - 1)d_2$$

Therefore, if $d_1$, $d_2$ and A are set to satisfy the above condition, the construction of flat layer can be obtained, as shown in FIG. 2C.

In the meantime, a flat insulating film can be formed on the second metal layer by anodic oxidation. In this case, anodic oxidation is carried out in the process of FIG. 2B, as shown in FIG. 2C' in order that the unmasked regions are thicker than the masked region by anodic oxidation.

Figure 2D:
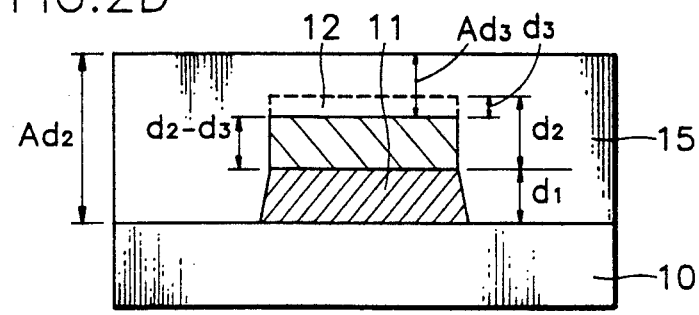

Subsequently, when the masked region is anodized in the same manner as that of FIG. 2B, a flat insulating layer 15 is obtained, as shown in FIG. 2D.

When a thickness of the anodized region in the second metal layer 12 is designated with $d_3$, the thickness of the anodized second metal layer becomes $Ad_3$. In this case, the relationship between $d_1$, $d_2$, $d_3$ and A is defined as the following formulae:

$$Ad_2 = d_1 + (d_2 - d_3) + Ad_3$$

$$\therefore d_1 = (A - 1)d_2 - (A - 1)d_3$$

$$= (A - 1)(d_2 - d_3)$$

Therefore, if $d_1$, $d_2$, $d_3$ and A are set to satisfy the above formulae, the construction of flat layer can be obtained as shown in FIG. 2D.

A thickness of the patterned second metal layer 12 is $d_2 - d_3$ and the region of the second metal layer that is not anodizable become an electrode with the first metal layer 11, and can be a gate electrode of a thin film transistor used in a liquid display.

Figure 3A:
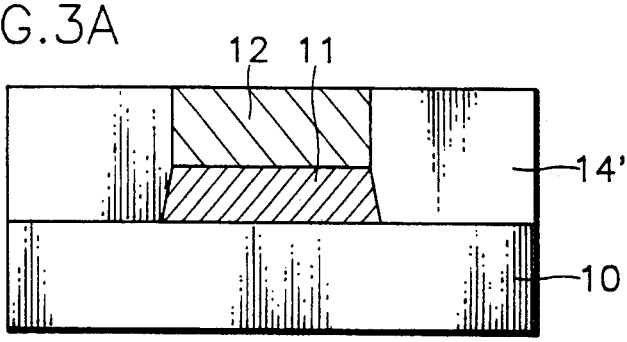
FIGS. 3A to 3B are schematic views of first and second embodiments of the invention.
Figure 3B:
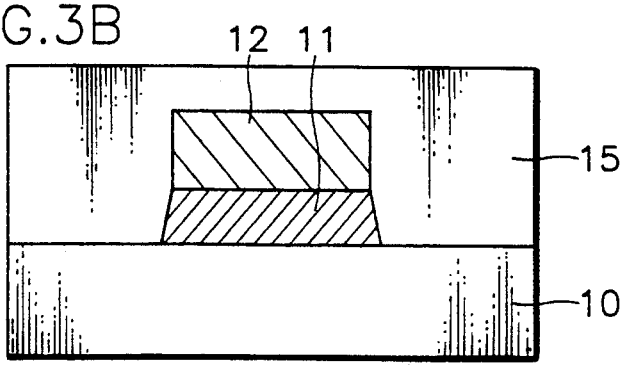

The results and structures of the above embodiment are respectively illustrated in FIGS. 3A and 3B. The present applied embodiment takes as an example the formation of a thin film transistor of reverse staggered type, and this can be applied to the case that a source/drain electrode is first formed on a substrate. In this case, a semiconductor layer and an insulating layer are flatly deposited on the formed surface that is made flat according to the present invention, and a gate electrode is formed thereon whereby problems of step coverage of such serially deposited layers cannot occur.

An advantage of the structure of the present invention is that when two electrode lines, i.e., lines of a gate electrode and a source/drain electrode are crossed by each other, and an insulating layer lies between the electrodes in order to prevent mutual contact, a step is not formed at the part of intersection, thereby preventing short circuit between two electrodes due to step coverage.

Furthermore, an anodic oxide layer is transparent and can be used in a liquid crystal display panel, and the present invention provides products of good quality.

A third embodiment concerning a method of fabricating a metal electrode of semiconductor device according to the present invention will now be described in detail, referring to FIGS. 4A to 4D.

FIGS. 4A to 4D are a third embodiment of successive manufacturing stages according to the present invention.

Figure 4A:
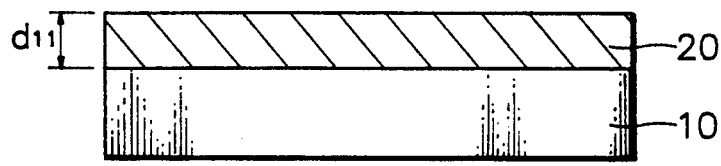
FIGS. 4A to 4D are schematic views showing successive manufacturing stages of a third embodiment according to the present invention.

First, a first metal layer 20 is deposited on a semiconductor substrate or an insulating substrate 10 of glass type to a thickness $d_{11}$ by carrying out sputtering, as shown in FIG. 4A. Metal materials such as Al or Ta can be used which are suitable for anodic oxidation.

Figure 4B:
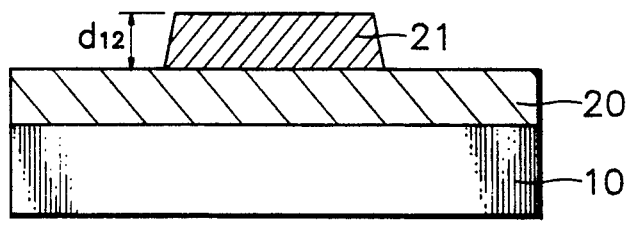

Subsequently, a second metal layer 21 is deposited on the substrate on which the first metal layer 20 has been formed such that a gate electrode pattern is formed as shown in FIG. 4B. As a material of the second metal layer 21 used here, materials that are not anodizable such as Cu or Cr may be used, and a thickness thereof is designated with "$d_{12}$".

Figure 4C:
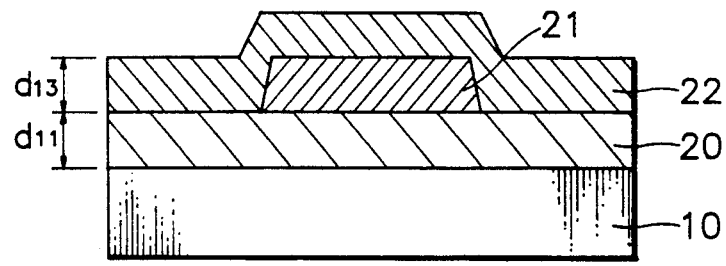

In order that the second metal layer 21 becomes a buried layer capable of acting as a mask at the time of anodic oxidation, a metal layer 22 made of a material equal to or equivalent to the first metal layer 20 is deposited throughout the surface to a thickness $d_{11}$ as shown in FIG. 4C such that a third metal layer 22 is formed on the portion of the gate electrode. Thus, the second metal layer 21 has a configuration of being buried between the first and third metal layer, as shown in the drawing.

Figure 4D:
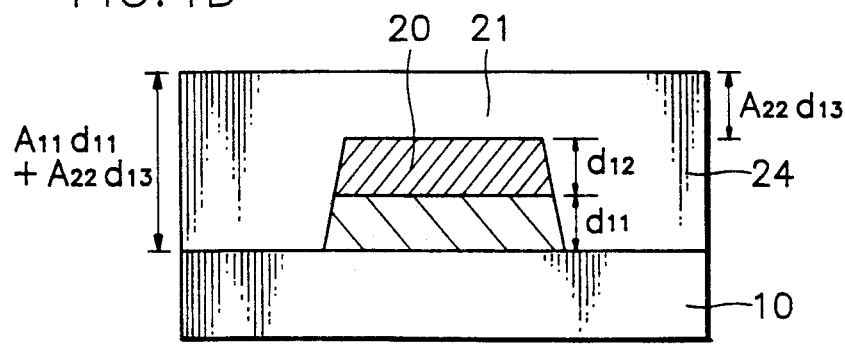

Referring now to FIG. 4D, the substrate of FIG. 4C having the layers shown therein is placed in an electrolytic chamber and is anodized for a given time, being supplied with voltage and current of a proper level to assure that the whole deposited metal layers are anodized and become oxide layers.

By the way, in anodic oxidation, since a metal pattern can be protected by a proper mask film, and the buried metal layer 21 is used as a mask in the present embodiment, the region other than the second metal layer 21 and the patterned first metal layer 20 can be an oxide layer 24.

What is important is that the present invention provides a flat surface, and the relationship of thicknesses of metal layers are defined as follows so as to form flat surfaces, as shown in FIG. 4D.

After carrying out anodic oxidation, provided a variation rate of thickness of the first metal layer 20 and the third metal layer 22 are respectively $A_{11}$ and $A_{22}$, and a thickness of the anodized region of the third metal layer 22 is designated with $d_{13}$, the following formulae is defined therebetween. Since the thickness of the buried second metal layer 21 does not change, a thickness of the region where the buried layer 21 is placed becomes $d_{11}+d_{12}+A_{22}d_{13}$, and a thickness of the other region becomes $A_{11}+d_{11}+A_{22}d_{13}$. Therefore, the following formula between the thicknesses can be obtained to result in a construction not having step-like difference between layers:

$$d_{11}+d_{12}+A_{22}d_{13}=A_{11}d_{11}+A_{22}d_{12}$$

$$\therefore D_{12}=(A_{11}-1)d_{11}$$

In accordance with this condition, when the second metal layer is formed, a thickness of the second metal layer is formed to be $(A_{11}=1)$ times as thick as the thickness of the first metal layer "$d_{11}$" thereby obtaining a flattened surface which is a final result, as shown in FIG. 4D.

Like the first and second embodiments, the present applied embodiment is an example of forming a thin film transistor of reverse staggered type, and this can be applied to a case that source/drain electrodes are first formed on a substrate. Such a case has an architecture that a semiconductor layer and an insulating layer are flatly deposited on the flat semiconductor formation according to the present invention, and a gate electrode is formed thereon, and thus, step coverage of serially deposited layers does not occur.

An advantage of the architecture of this invention has already mentioned in the foregoing embodiments.

As another preferred embodiment of this invention, a fourth preferred embodiment will now be described in detail referring to FIGS. 5A to 5C.

Figure 5A:
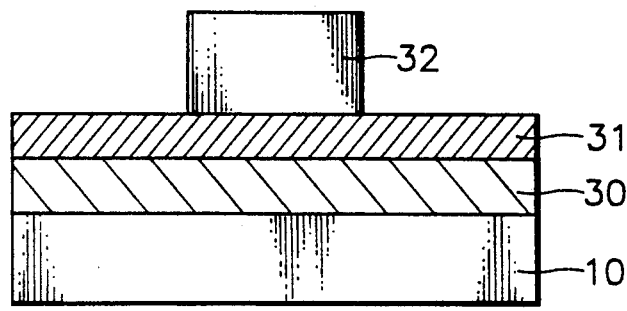
FIGS. 5A to 5C are schematic views showing manufacturing stages of a fourth embodiment according to the present invention.
Figure 5B:
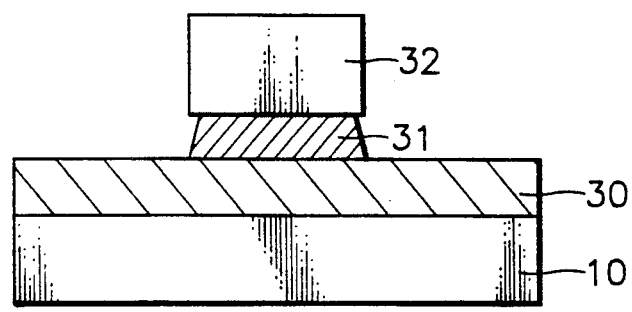
Figure 5C:
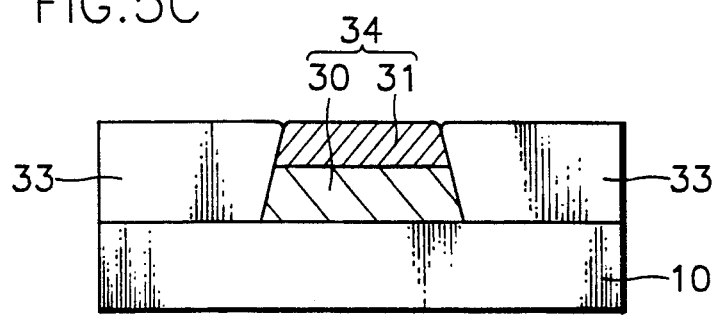

FIGS. 5A to 5C illustrate a fourth embodiment of successive manufacturing stages according to the present invention.

Referring to FIG. 5A, a first metal layer 30, a second metal layer 31 and a pattern of photo-sensitive film 32 are serially formed on a given substrate 10. Here, insulators such as an oxide film and/or a nitride film or BPSG (Boro-Phosphor Silicate Glass), PSG (Phosphor Silicate Glass) and USG (Undoped Silicate Glass) and insulators of glass type can be used as a substrate 10. The above first and second metal layers 30 and 31 are formed by a physical depositing method or a chemical vapor depositing method. The first metal layer 30 is made of materials that may be used for anodic oxidation such as Al or Ta, and the second metal layer 31 is made of materials that are not anodized such as Cu, Au, Cr or W.

Referring to FIG. 5B, the exposed second metal layer 31 is removed by dry or wet etching method. The remaining second metal layer 31 is diagonally etched so as to reduce differential step that is occurred between insulating films 33 and the second metal layer 31 during anodic oxidation.

Referring to FIG. 5C, the above pattern of photo-sensitive film 32 and second metal layer 31 diagonally etched are used as a mask. The first metal layer 30 is oxidized by well-known anodic oxidation, and the insulating films 33 are then formed.

At this point, the first metal layer 30 underneath the second metal layer 31 must not be anodized.

Therefore, a gate electrode 34 is made of the first metal layer 30 that the second metal layer 31 is not oxidized. After that, the pattern of photo-resist film 32 is removed. During the anodic oxidation, the first metal layer 30 is oxidized to the insulating layer 33 and its size or thickness increases vertically. If the vertical size of the first and second metal layers 30 and 31 were properly regulated in consideration of the measure of the vertically increased size, the differential step between the gate electrode 34 and the insulating layers 33 could be minimized.

For example, if the first metal layer 30 was made of Al, Al would be oxidized to $Al_2O_3$ according to anodic oxidation, and a vertical size thereof increased by 1.4 times.

Thus, the variation rate of thickness A is about 1.4 by anodic oxidation, and if vertical sizes of the first metal layer 30 and the second metal layer 31 were in the ratio of 1 to 0.4, the differential step between the insulating layers 33 and the second metal layer 31 could be prevented during anodic oxidation.

When it comes to metallization according to the present invention, a first metal layer and a second metal layer are formed, and after the second metal layer is diagonally etched, a metallization layer covered with insulating layers is formed by anodic oxidation of the first metal layer. Thus, the differential step between the substrate and metallization layer is removed, and step coverage is advanced during later processes of forming a semiconductor film, a metallization layer or insulating layers thereby improving reliability and efficiency of the semiconductor device.

It should be understood that the specific processes described are illustrative of the preferred embodiments of the invention but that variations may be made consistent with the general principles of the invention.

What is claimed is:

1. A method of fabricating a metal electrode of a semiconductor device comprising the steps of:
    forming a first metal layer, which is anodizable, to a first predetermined thickness on a substrate;
    forming and patterning a second metal layer, which is not anodizable, to a second predetermined thickness so as to act as a mask on said first metal layer;
    depositing a third metal layer, that may be anodizable, to a third predetermined thickness and having a nonflat surface; and
    flattening the surface of the third layer by anodic oxidation of the first and third layers using the second layer as a mask.

2. A method as recited in claim 1, wherein the thickness of said third metal layer is equal to that of the first metal layer.

3. A method as recited in claim 1, wherein the thicknesses of the first metal layer and second metal layer are respectively designated with $d_1$ and $d_2$, and the variation rate of thickness of the first metal layer by anodic oxidation is designed A, further comprising controlling the thickness $d_2$ of the second metal layer to satisfy the formulae: $d_2 = (A-1)d_1$.

4. A method as recited in claim 1, wherein said first metal layer is selected from the group consisting of Ta and Al, and said second metal layer is selected from the group consisting of Cu and Cr.

5. A method as recited in claim 1 wherein said process is applied to any one of a thin film transistor of reverse staggered type or a thin film transistor of staggered type, and the manufacturing stage of a semiconductor device having a metal pattern with step-like difference between layers for flattening.

* * * * *

UNITED STATES PATENT AND TRADEMARK OFFICE
CERTIFICATE OF CORRECTION

PATENT NO. : 5,240,868
DATED : August 31, 1993
INVENTOR(S) : Byungseong Bae; Jeongha Sohn; Insik Jang; Sangsoo Kim; Namdeog Kim; Hyungtaek Kim It is certified that error appears in the above-indentified patent and that said Letters Patent is hereby corrected as shown below:

Column 3, line 41, change "$Ad_2=d_2+d_2$" to -- $Ad_2=d_1+d_2$ --.

Column 4, line 54, change "$d_{11}$" to -- $d13$ --.

Column 5, line 17, change "$A_{11}+d_{11}+A_{22}d_{13}$" to -- $A_{11}d_{11}+A_{22}d_{13}$ --.

Column 5, line 23, change "$d_{12}$" (second occurrence) -- $d_{13}$ --.

Column 5, line 28, change "$(A_{11}=1)$ to -- $(A_{11}-1)$ --.

Column 6, line 68, change "designed" to -- designated --.

Signed and Sealed this

Seventeenth Day of May, 1994

Attest:

BRUCE LEHMAN

Attesting Officer    Commissioner of Patents and Trademarks